(12) United States Patent
Wu et al.

(10) Patent No.: US 6,169,246 B1
(45) Date of Patent: Jan. 2, 2001

(54) PHOTOVOLTAIC DEVICES COMPRISING ZINC STANNATE BUFFER LAYER AND METHOD FOR MAKING

(75) Inventors: Xuanzhi Wu, Golden; Peter Sheldon; Timothy J. Coutts, both of Lakewood, all of CO (US)

(73) Assignee: Midwest Research Institute, Kansas City, MO (US)

( * ) Notice: Under 35 U.S.C. 154(b), the term of this patent shall be extended for 0 days.

(21) Appl. No.: 09/149,430

(22) Filed: Sep. 8, 1998

(51) Int. Cl.$^7$ .................................................. H01L 31/00
(52) U.S. Cl. ............................................ 136/265; 438/487
(58) Field of Search .............................. 136/265; 438/487

(56) References Cited

U.S. PATENT DOCUMENTS

| | | | |
|---|---|---|---|
| 4,207,119 | 6/1980 | Tyan | 136/89 TF |
| 4,254,093 | 3/1981 | Faria et al. | 423/561 B |
| 4,393,267 | 7/1983 | Peterson | 136/260 |
| 4,445,965 | 5/1984 | Milnes | 156/624 |
| 4,463,215 | 7/1984 | Bassett et al. | 136/244 |
| 4,529,832 | 7/1985 | Sher et al. | 136/260 |
| 4,536,607 | 8/1985 | Wiesmann | 136/249 |
| 4,611,091 | 9/1986 | Choudary et al. | 136/260 |
| 4,650,921 | 3/1987 | Mitchell | 136/258 |
| 4,826,777 | 5/1989 | Ondris | 437/2 |
| 5,261,968 | 11/1993 | Jordan | 136/244 |
| 5,304,499 | 4/1994 | Bonnet et al. | 438/967 |

OTHER PUBLICATIONS

J.F. Jordan, *Solar Cells*, 23, pp. 107–113 (1988).
B.M. Basol, *Solar Cells*, 23, pp. 69–88 (1988).
B.E. McCandless and S.S. Hegedus, $22^{nd}$ *IEEE SPVC Proc.*, pp. 967–972 (1991).
A. Rohatgi et al., $22^{nd}$ *IEEE SPVC Proc.*, pp. 962–966 (1991).
C. Ferekides et al., $23^{nd}$ *IEEE SPVC Proc.*, pp. 389–393 (1993).

Primary Examiner—Mark Chapman
(74) Attorney, Agent, or Firm—Ken Richardson; Paul J. White

(57) ABSTRACT

A photovoltaic device has a buffer layer zinc stannate $Zn_2SnO_4$ disposed between the semiconductor junction structure and the transparent conducting oxide (TCO) layer to prevent formation of localized junctions with the TCO through a thin window semiconductor layer, to prevent shunting through etched grain boundaries of semiconductors, and to relieve stresses and improve adhesion between these layers.

29 Claims, 5 Drawing Sheets

$V_{oc}$ = 0.8284 V
$I_{sc}$ = 18.36 mA
$J_{sc}$ = 24.48 mAcm$^{-2}$
Fill Factor = 73.80 %

$V_{max}$ = 0.6834 V
$I_{max}$ = 16.42 mA
$P_{max}$ = 11.22 mW
Efficiency = 15.0 %

PHOTOVOLTAIC DEVICES COMPRISING ZINC STANNATE BUFFER LAYER AND METHOD FOR MAKING

CONTRACTUAL ORIGIN OF THE INVENTION

The United States Government has rights in this invention under Contract No. DE-AC36-83CH10093 between the U.S. Department of Energy and the National Renewable Energy Laboratory, a Division of Midwest Research Institute.

BACKGROUND OF THE INVENTION

1. Field of the Invention

The present invention relates generally to photovoltaic devices and more particularly to thin film CdS/CdTe heterojunction solar cells comprising a zinc stannate ($Zn_2SnO_4$) buffer layer between the CdS window layer and a transparent conducting oxide (TCO) contact layer.

2. Description of the Prior Art

Cadmium telluride (CdTe) has long been recognized as a promising semiconductor material for thin-film solar cells due to its band gap of 1.44 eV, which is near optimum for solar energy absorption, and due to high direct absorption coefficient. CdTe is typically coupled with a second semiconductor material of different conductivity type, such as cadmium sulfide (CdS), to produce a high-efficiency heterojunction photovoltaic cell. Small-area CdS/CdTe heterojunction cells with efficiencies of photon energy to electrical energy conversion greater than 15% and commercial-scale modules with efficiencies of greater than 9% have been demonstrated. CdTe films have been produced using various deposition techniques, including close-space sublimation or "CSS" (U.S. Pat. No. 5,304,499, issued Apr. 19, 1994, to Bonnet et al.), spray deposition (e.g., J. F. Jordan, *Solar Cells*, 23 (1988) pp. 107–113), and electrolytic deposition (e.g., B. M. Basol, *Solar Cells*, 23 (1988), pp. 69–88).

A typical thin film solar cell device, including the CdS/CdTe heterojunction devices described above, may have an optically transparent substrate that provides structural support for the thin film layers of dissimilar semiconductor materials (e.g., CdS and CdTe) that comprise the junction and form the solar energy absorption media. Generally, optically transparent substrates are not electrically conductive, so a thin layer of transparent conductive oxide (TCO) is deposited between the substrate and the first semiconductor layer to function as a front contact current collector. A back contact of conductive film, usually a metal, is deposited on the CdTe.

A well known advantage of heterojunction solar cells, such as CdS/CdTe structures, is that they can have a relatively wide band gap in the front layer component of the cell (e.g., CdS with a bandgap of about 2.4 eV) which provides a window action that allows more of the electromagnetic solar radiation to pass through the front layer component and penetrate into the underlying direct band gap component, where the electromagnetic solar radiation is absorbed (e.g., CdTe with a bandgap of about 1.44eV), to create electron-hole pairs. However, the window layer component with its wider band gap does absorb some of the electromagnetic solar radiation, especially in the shorter wavelengths below about 500 nm before it can reach the underlying absorption layer. Therefore, that shorter wavelength, e.g., blue light energy is lost as heat instead of being usefully converted to electric current. Reducing the thickness of the window layer reduces this solar energy absorption in the window layer so that it can be absorbed in the underlying layer, yielding increased short-circuit current ($J_{sc}$) and improved overall conversion efficiency of the device. In CdS/CdTe solar cells, such reduction in the thickness of the CdS window layer allows more of the shorter wavelength or blue solar radiation to reach and be absorbed by the CdTe layer, thus improving the blue spectral response of the device.

Unfortunately, reducing the thickness of the CdS film can also cause other problems that are detrimental to the electrical quality and performance of the heterojunction device. For example, the thinner the CdS film, the greater the probability of interface defects (commonly referred to as "pinholes"), which create localized TCO/CdTe junctions that result in reduced open-circuit voltage ($V_{oc}$) and fill factor (FF). For example, creation of such localized TCO/CdTe junctions can lower the $V_{oc}$ of a CdS/CdTe heterojunction solar cell from a range of 800–850 mV down to a range of about 300–400 mV, depending on the severity and density of the pinholes, thickness of the CdS layer, and several other factors. Therefore, while thinner CdS window layers are desirable for obtaining higher solar energy conversion efficiency and higher $J_{sc}$ current technology is limited in how thin the CdS front or window layer can be made before the reduction of $V_{oc}$ and FF due to creation of pinholes as described above.

Another problem commonly associated with fabrication of thin film semiconductor devices is the formation of the back electrical contacts in a low resistance, ohmic manner to the CdTe layers. One conventional technique is to chemically etch the CdTe layer prior to deposition of the metallic back contact to form a tellurium rich $p^+$ conductivity region at the exposed surface of the CdTe. Then the back contact is either deposited on the etched surface of the CdTe layer using metals such as gold or nickel, or it is formed by applying a HgTe:Cu doped graphite paste. Unfortunately, conventional chemical etching is difficult to control and the CdTe layer is polycrystalline, so excessive chemical etching can preferentially etch grain boundaries in the polycrystalline CdTe, removing Cd to leave highly conductive Te channels extending through the CdTe layer to the CdS/CdTe junction, often corroding through the CdS layer and into close proximity to the TCO layer. Once the back contact is deposited, such channels can form highly conductive shunts that cause electrical short circuits between the front TCO contact and the back metal contact and reduce $V_{oc}$, of the device. Therefore, while the chemical etching can enhance a desirable ohmic contact between the CdTe layer and the back contact layer, it can also have a detrimental effect on the $V_{oc}$, thereby adversely affecting solar energy conversion efficiency of the device.

Before the chemical etching step described above, an annealing step, which typically involves heating the CdS/CdTe semiconductor heterojunction structure in a $CdCl_2$ atmosphere, is considered by persons skilled in the art to be almost essential to produce high-efficiency CdTe devices. Such annealing provides a number of benefits, including increased grain size, grain boundary passivation, improved CdS/CdTe interface alloying, and reduced lattice mismatch between the CdS and CdTe layers. Unfortunately, $CdCl_2$ heat treatment, like chemical etching, is difficult to control, and over-processing can significantly reduce both device performance and product yield. Moreover, it is believed that grain growth, although a generally desirable result of $CdCl_2$ heat treatment, can induce stress at the TCO/CdS interface, causing blistering or peeling of the semiconductor layers.

Most efforts to solve these problems in constructing high-efficiency CdS/CdTe semiconductor heterojunction devices have been directed to refining layer compositions, thicknesses, and processing control parameters to optimize a balance between the beneficial and adverse effects described above, although the U.S. Pat. No. 5,261,968 issued to Jordan addresses the problem of pinhole shunts between the TCO and CdTe layers through the CdS layer by interposing a low conductivity tin oxide layer between the high conductivity TCO layer and the CdS layer. In that patent, the TCO is a high conductivity tin oxide, while the interposed low conductivity tin oxide layer has its carrier concentration adjusted by a cadmium, zinc, or other metal dopant so that it provides an active junction with the CdTe layer in areas where flaws, such as pinholes, extend through the CdS window layer of the CdS/CdTe heterojunction structure. However, solutions to the problem of electrical short circuits through grain boundary shunts from chemical etching of the CdTe layer and to the problems of blistering and peeling between the TCO/CdS layers and other degradation from over processing in the annealing step have remained elusive prior to this invention.

SUMMARY OF THE INVENTION

Accordingly, it is a general object of this invention to provide a thin film CdS/CdTe heterojunction photovoltaic device having improved electrical, mechanical and optical properties.

It is a more specific object of this invention to provide a method and structure for minimizing or eliminating adverse effects of pinholes and other flaws in thin CdS window layers of CdS/CdTe heterojunction devices and thereby enable use of thinner CdS layers to increase blue spectral response, increase short circuit current $J_{sc}$ and maintain open-circuit voltage ($V_{oc}$), and fill factor (FF), thereby increasing overall solar energy conversion efficiency of such devices.

It is an even more specific object of this invention to minimize or eliminate localized TCO/CdTe junctions or shunts through thin CdS window layers in CdS/CdTe heterojunction devices.

It is another specific object of this invention to provide a method and structure for minimizing or eliminating adverse effects of a chemical etching step used prior to application of metallized back contacts in CdS/CdTe heterojunction devices.

It is another more specific object of this invention to provide a method and structure that minimizes or eliminates electric shunts or short circuits between front TCO contact layers and back metallized contact layers in CdS/CdTe devices that occur from undesirable preferential etching in grain boundaries of polycrystalline CdTe layers in such devices and thereby enhance open circuit voltage ($V_{oc}$) and overall solar energy conversion efficiencies of such devices.

It is still another specific object of this invention to provide a method and structure for minimizing or eliminating adverse effects of heat annealing treatment of CdS/CdTe heterojunction structures, especially such adverse effects from stress at TCO/CdS interfaces that result from $CdCl_2$ heat treatment.

It is still another more specific object of this invention to minimize or eliminate blistering or peeling of the CdS/CdTe layers from the TCO front contact layer of CdS/CdTe device which can result from the beneficial $CdCl_2$ heat treatment and other variations of heat treatment of the CdS/CdTe heterojunction structure.

It is an even more desirable object of this invention to provide an improved method and structure that not only minimizes or eliminates adverse effects of pinholes and other flaws in thin CdS front window layers used to increase blue spectral response, but which also minimizes or eliminates adverse effects of chemical etching used to enhance formation of low resistivity back metallilzed contacts as well as adverse effects of $CdCl_2$ heat treatments used to increase grain size, provide grain boundary passivation, improve CdS/CdTe interface alloying and reduce lattice mismatch between the CdS and CdTe layers and thereby allows use of not only thinner CdS front window layers but also such chemical etching and $CdCl_2$ heat annealing treatments to increase short circuit current ($J_{sc}$) open circuit voltage ($V_{oc}$) and fill factor (FF) of CdS/CdTe heterojunction devices while enhancing manufacturability of such devices.

To achieve the foregoing and other objects and in accordance with the purposes of the present invention, as embodied and broadly described therein, the articles of manufacture of this invention include a layer of zinc stannate interposed between the TCO front contact layer and the CdS front window layer of a CdS/CdTe heterojunction device. Therefore, in accordance with this invention, such a semiconductor photovoltaic device may comprise a transparent substrate, a layer of transparent conducting oxide (TCO) disposed on said substrate as a front contact, a layer of zinc stannate ($Zn_2SnO_4$) disposed on said transparent conducting oxide as a buffer layer, a thin film comprising two or more layers of semiconductor materials disposed on said layer of zinc stannate, and an electrically conductive film disposed on said thin film of semiconductor materials to form a rear electrical contact to said thin film. Further, for a CdS/CdTe heterojunction photovoltaic device, the two or more layers of semiconductor material may comprise a thin CdS front window layer to increase transmission of shorter wavelength (less than 500 nm) solar radiation into the CdTe absorption layer, regardless of whether such thin CdS front window layer has pinholes or other flaws.

To further achieve the foregoing and other objects and in accordance with the purposes of the present invention, as embodied and broadly described therein, one embodiment of this invention comprises a process for preparing a photovoltaic device having a layer of zinc stannate as a buffer layer between the transparent conductive oxide and semiconductor layers. The method of this invention includes depositing a transparent conductive oxide layer onto a transparent substrate, depositing a zinc stannate layer onto the layer of transparent conductive oxide, depositing thin films of two or more layers of semiconductor materials to form a p/n or p/i/n junction onto the layer of zinc stannate, and depositing an electrically conductive film onto the thin film layers of semiconductor materials. Further, for a CdS/CdTe heterojunction photovoltaic semiconductor device, the method can include a $CdCl_2$ or other heat annealing treatment to increase grain size, provide grain boundary passivation, improve CdS/CdTe interface alloying, and reduce lattice mismatch between the CdS and CdTe layers, and the method can also include chemically etching the CdTe layer prior to application of the back contact layer to enhance formation of a low resistivity CdTe contact interface.

BRIEF DESCRIPTION OF THE DRAWINGS

The accompanying drawings, which are incorporated in and form apart of the specifications, illustrate the preferred embodiments of the present invention, and together with the descriptions serve to explain the principles of the invention. In the Drawings.

The file of this patent contains a sheet of black and white micrograph, drawing comprising of FIG. 3. Copies of this patent with black and white micrograph drawings will be provided by the United States Patent and Trademark Office upon request and payment of the necessary fee.

DETAILED DESCRIPTION OF THE PREFERRED EMBODIMENTS

Figure 1:
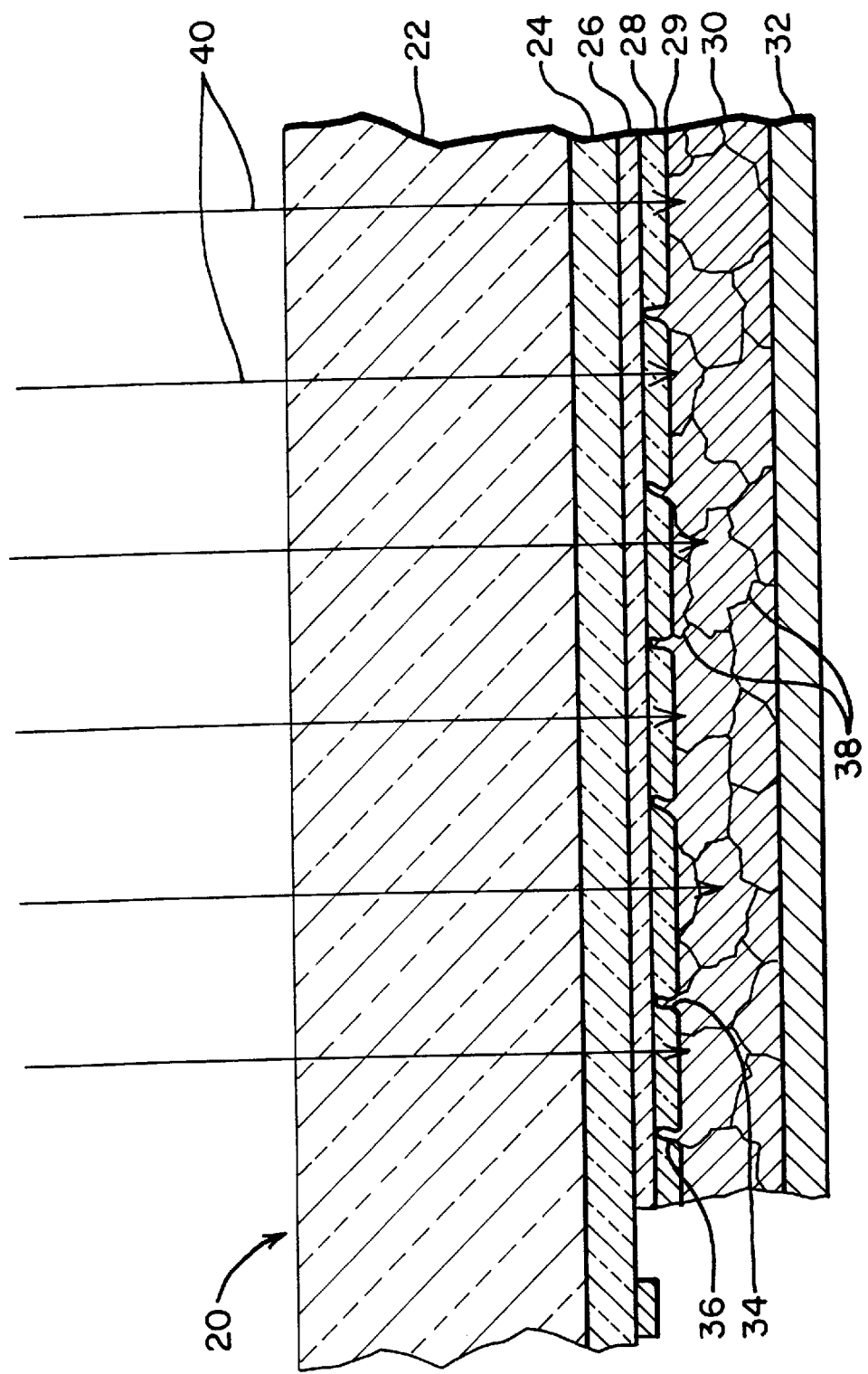
FIG. 1 is a cross-sectional view (not in actual scale or proportion) of a photovoltaic device, such as a solar cell, in accordance with the present invention.

A photovoltaic device 20 according to the present invention is illustrated diagrammatically in FIG. 1, where an active junction 29 formed by two or more semiconductor layers 28, 30 with a front contact 24 and a back contact 32 is formed on a substrate 22. In the preferred embodiment of this invention, a zinc stannate ($Zn_2SnO_4$) buffer layer 26 is interposed between the front contact layer 24 and the semiconductor layer 28 for purposes that will be described in more detail below. Also in the preferred embodiment, the substrate 22 is a rigid transparent material, such as glass, so that electromagnetic radiation 40, such as light from the sun (not shown), can enter the semiconductor material 30, where its energy is absorbed and converted to electric energy. A transparent conductive oxide (TCO) layer is used for the front contact 24 so that it also transmits the solar radiation 40 to the semiconductor layer 30. Since all of the radiation 40 should be absorbed in the semiconductor layer 30, the back contact 32 can be metallic.

When the active semiconductor layers 28, 30 are CdS and CdTe, respectively, to provide a CdS/CdTe heterojunction, the CdS layer 28 is best constructed very thin, because CdS is not completely transparent to solar radiation 40, especially the shorter wavelength radiation or blue light (shorter than about 500 nm). The thinner the CdS layer 28, the more the shorter wavelength portion of the radiation 40 is transmitted into the CdTe layer 30, where it can be absorbed and converted to electric energy. However, the thinner the CdS layer 28, the more likely it will have pinholes 34 or other flaws, which allow protrusions 36 of the CdTe of layer 30 through the CdS layer 28. The zinc stannate buffer layer 26 is very transparent, so it does not block radiation 40 from reaching the CdTe layer 30, but zinc stannate is not very conductive, so it prevents the protrusions 36 from forming localized TCO/CdTe junctions between the CdTe layer 30 and the TCO layer 24, which would otherwise cause lower open circuit voltage ($V_{oc}$) for the device 20.

It is very difficult to achieve heavy p-type doping in the CdTe layer 30. Therefore, to make a low resistance back contact with metallized layer 32, a wet chemical etch may be used to form a $p^+$ surface region before applying the metallic back contact layer 32. Although such $p^+$ surface region on the exposed CdTe layer 30 facilitates formation of a low resistance, ohmic contact with back contact layer 32, the wet etches used to form that $p^+$ surface region also preferentially etch grain boundaries 38 in the polycrystalline CdTe. Such etching removes Cd in those grain boundaries 38, leaving metallic Te that provides highly conductive shunt paths. These shunt paths can extend not only through the CdTe layer 30, but often also through the CdS layer 28 as well. The zinc stannate layer 26 is chemically stable and cannot be etched in HCl, $HNO_3$, or nitric/phosphoric based acid etches that may be used in the acid etching described above. Therefore, the zinc stannate layer 26 is also effective to prevent the shunt paths described above from extending to the TCO front contact layer 24, which would degrade the device parameters and adversely impact solar energy conversion efficiency.

Before the etch step described above, the CdS/CdTe structure is annealed with a $CdCl_2$ or other heat treatment to increase grain size, passivate grain boundaries, increase CdS/CdTe interface alloying, and reduce lattice mismatch between the CdS layer 28 and the CdTe layer 30. The grain growth is desirable for the improvement of solar energy conversion efficiency, but it increases stress in the structure that can cause adhesion problems between layers, especially between the TCO layer 24 and the CdS layer 28. However, the zinc stannate ($Zn_2SnO_4$) layer 26 interposed between the TCO layer 24 and the CdS layer 28 reacts with the CdS layer 28 during the annealing described above to improve adhesion and prevent blistering or peeling between those layers. The zinc stannate layer 26, which is initially deposited in amorphous form, crystallizes into a single-phase spinel structure after thermal annealing at approximately 600° C., which is not only very smooth and chemically inert, but also reduces stress between the CdS layer 28 and the TCO layer 24, and the adhesion between the zinc stannate layer 26 and the TCO layer 24 is very good. Therefore, the zinc stannate buffer layer 26 reduces stresses and provides enhanced adhesion between layers of the device 20, which provides much greater process latitude when optimizing the $CdCl_2$ heat process.

The illustrations of photovoltaic device 20 and its various portions or components in FIG. 1 are not intended to be drawn to scale or even in proportion, because the very thin components and layers of the photovoltaic device 20 are impractical, if not impossible, to illustrate to scale or in proper proportion. Therefore, FIG. 1 is for illustrative purposes only, as will be understood by persons skilled in this art.

The present invention also provides a method of making a photovoltaic device 20, which method includes depositing a film of transparent conductive oxide 24 onto a transparent substrate 22, then depositing a film of zinc stannate 26 onto the TCO film 24. The zinc stannate film 26 is formed by RF sputtering a layer of $Zn_2SnO_4$ onto a suitable transparent substrate 22, which has been previously coated with a TCO film 24. Following deposition of the zinc stannate film 26, at least two semiconductor materials of differing conductivity types (semiconductor layers 28 and 30) are deposited on the zinc stannate film 26 to function as a semiconductor for the device 20.

For the purpose of providing a detailed description and an enabling embodiment, but not for the purpose of limitation, this description refers to a first semiconductor layer 28 of CdS and a second semiconductor layer 30 of CdTe. However, the present invention can be practiced using any suitable combination of semiconductor materials of differing conductivity types including, but not limited to, CdS/CdTe, CdS/HgCdTe, CdS/CdZnTe, CdS/ZnTe, CdS/CIS, and CdS/CIGS. In addition to the aforementioned dissimilar semiconductor materials, the present invention can also be practiced using another semiconductor material, such as amorphous silicon and polycrystalline thin-film silicon.

As is apparent to persons skilled in the art, the substrate 22 for the TCO film 24 must be optically transparent over the range of light wavelengths for which transmission through the substrate is desired. Suitable transparent substrates 22 allowing transmission of visible light include silica and glass. Also, the transparent substrate 22 must be of a material capable of withstanding heat treatment at temperatures of 550° C. or more, as described below, and the TCO film 24 must adhere to the transparent substrate 22 material. The thermal expansion coefficient of the transparent substrate 22 must be close enough to the thermal expansion coefficient of the TCO film 24 and other semiconductor layers 28, 30 to prevent cracking or buckling of these films during heat treatment.

The transparent conductive oxide film 24 may comprise any suitable transparent conductive material known in the art, including, but not limited to, tin oxide, indium oxide, indium tin oxide (ITO), zinc oxide, and cadmium stannate. Preferably, the TCO film 24 comprises cadmium stannate ($Cd_2SnO_4$) or tin oxide. A particularly preferred method for depositing a film of cadmium stannate onto a transparent substrate 22 is described in a copending U.S. patent application filed Nov. 6, 1996, entitled "Thin Transparent Conducting Films of Cadmium Stannate," and copending U.S. patent application filed Nov. 18, 1996, entitled "Photovoltaic Devices Comprising Cadmium Stannate Transparent Conducting Films and Methods for Making," both of which are incorporated herein by reference.

In accordance with the present invention, a zinc stannate film 26 is created by RF sputtering from a hot-pressed target containing stoichiometric amounts of 33 mol % $SnO_2$ and 67 mol % ZnO onto the TCO film 24. The sputtering can be conducted in substantially pure oxygen which is substantially free of impurities which could react with the metal oxides present. Preferably, the oxygen is 99.999% pure. It is also preferred that the sputtering is at room temperature. As deposited by RF sputtering, the $Zn_2SnO_4$ layer is substantially amorphous. Zinc stannate films 26 prepared by the method described herein and having thicknesses of between about 200 and 3,000 Å, and preferably between about 800 and 1,500 Å, were found to have desirable mechanical, optical, and electrical properties.

After the deposition, the transparent substrate 22 with its TCO film 24 and zinc stannate film 26 is further processed to produce the photovoltaic device 20 of the present invention, as described below.

Following zinc stannate ($Zn_2SnO_4$) deposition, a first semiconductor layer 28 is deposited on the top surface of the zinc stannate film 26. Contiguous to the first semiconductor layer 28 is a second semiconductor layer 30 having a conductivity type that is different from the conductivity type of first semiconductor layer 28. A back electrical contact 32 is disposed over the second semiconductor layer 30 and in ohmic contact therewith. The semiconductor layers 28 and 30 and the back contact 32 may be formed by any known process, such as chemical bath deposition (CBD), vapor deposition, electro-deposition, sputtering, close-space sublimation (CSS), and the like. Preferably, the first semiconductor layer 28 is deposited by a chemical bath deposition and the second semiconductor layer 30 is deposited by close-space sublimation, as described in the Examples hereof.

The photovoltaic device 20 may include an electrical contact or electrode pad (not shown) on the TCO film 24, the function and construction of which is known in the art and not a part of this invention. The photovoltaic device 20 may further include an anti-reflective (AR) coating (not shown) on the front surface of the transparent substrate 22 to reduce reflection losses and thereby increasing the number of photons incident on the semiconductor material, which is also known in the art and not a part of this invention.

Figure 2:
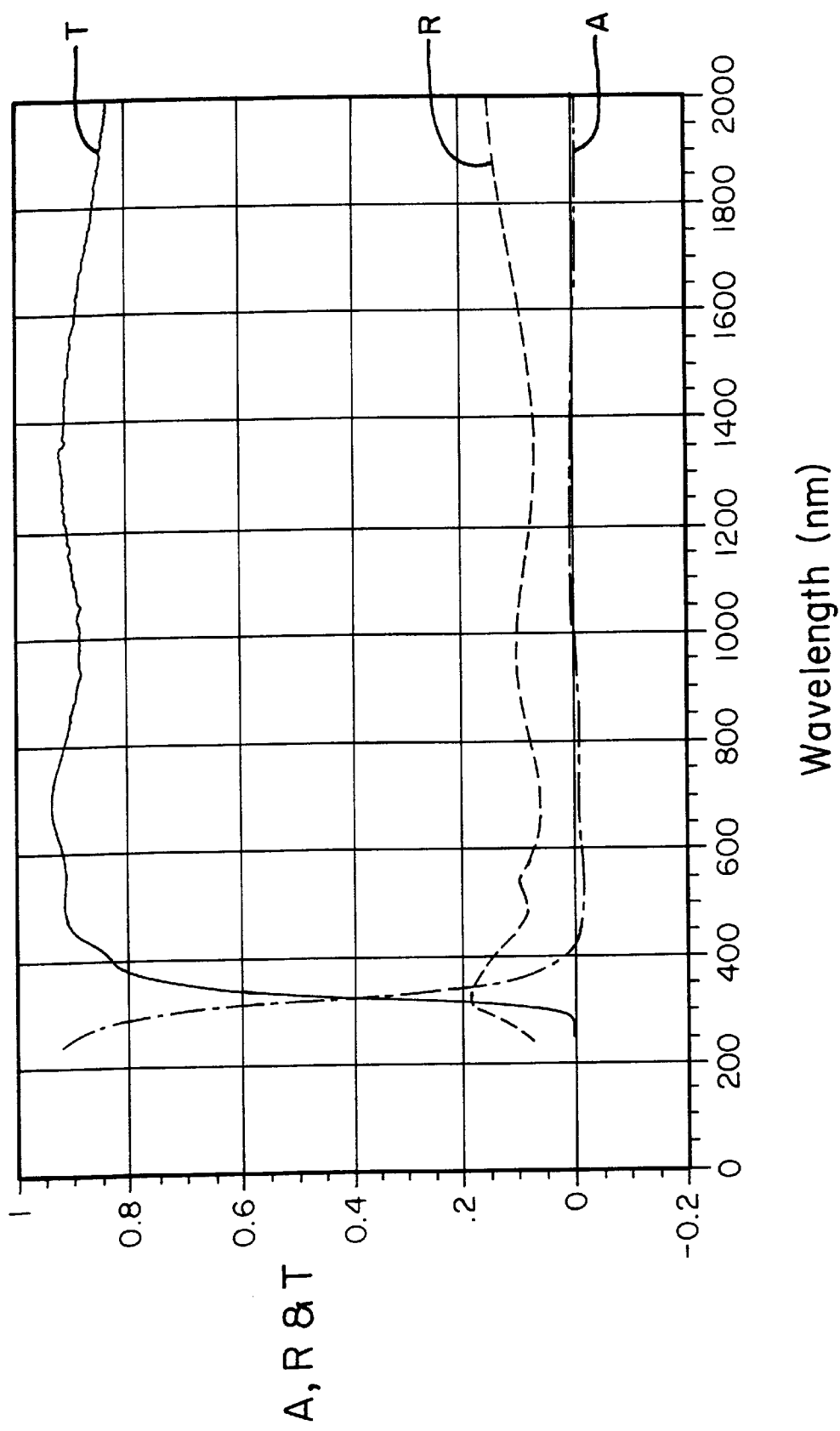
FIG. 2 is a graph showing the absorbance, reflectance, and transmittance for a zinc stannate film.

The transmittance, reflectance, and absorptance of a zinc stannate film 26 are illustrated in FIG. 2. The zinc stannate films 26 exhibit near zero absorptance at wavelengths greater than about 400 nm. Zinc stannate films 26 also have a wide optical bandgap (~3.3 eV). The zinc stannate layer has a resistivity of more than 1000 Ω-cm. However, annealing the zinc stannate layer in an Ar/CdS ambient at a temperature in a range of 500–600° C. decreases the resistivity to between about 0.1 and 10 Ω-cm, which matches the resistivity of the first semiconductor layer 28 (the CdS window layer).

A significant advantage associated with the photovoltaic device of the present invention is the improved device performance due to the high resistivity and high transmittance of the zinc stannate film 26. As will be appreciated by those of skill in the art, the conversion efficiency of a heterojunction semiconductor device can be increased by reducing the window layer absorption, which increases short-circuit current ($J_{sc}$). In CdS/CdTe solar cells, this is achieved by reducing the thickness of the CdS film to improve the blue spectral response. However, a relatively thin CdS film increases the probability of pinholes thereby forming localized TCO/CdTe junctions, which generally results in a reduced open-circuit voltage ($V_{oc}$) and fill factor. During CdTe depositions and subsequent $CdCl_2$ heat treatment, the CdS film is either partially or completely consumed forming a $CdS_{1-x}Te_{dx}$ intermixed layer. The CdS consumption reportedly increases as the CdS film thickness decreases (B. E. McCandless and S. S. Hegedus, 22nd EEE SPVC Proc. (1991) pp.967–972). As the CdS film thins, additional pinholes can develop and create localized CdTe/TCO junctions, which reduce the open circuit voltage and fill factor. The photovoltaic device of the present invention eliminates these problems by including a zinc stannate film 26 between the TCO film 24 and the first semiconductor layer 28 (the CdS window layer). Because the resistivity of the zinc stannate film 26 matches the resistivity of the CdS window layer, the CdS film can be deposited in a thin layer without sacrificing open-circuit voltage ($V_{oc}$) and fill factor (FF).

Figure 3:
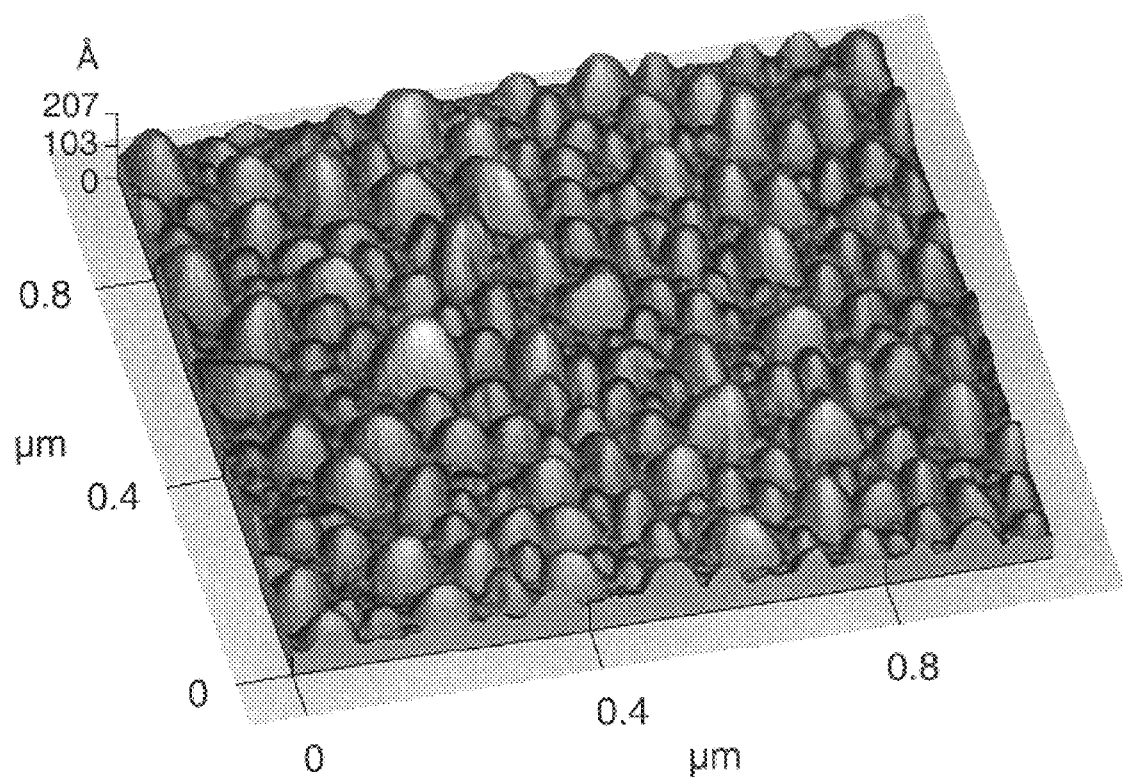
FIG. 3 is an atomic force micrograph showing the surface morphology of a zinc stannate film.

An atomic force micrograph of the surface of a zinc stannate film is shown in FIG. 3. As is evident from this figure, zinc stannate films 26 have very smooth surfaces, with an average surface roughness of ~20 Å. It is well known that the probability of pinhole formation increases, particularly for CSS deposited CdS, as the surface roughness of the underlying layer increases. See A. Rohatgi, et al., 22nd EEE SPVC Proc. (1991) pp. 962–966. Thus, because of the smooth surface morphology of the zinc stannate film 26, the likelihood of pinhole formation in the photovoltaic device of the present invention is small as compared to conventional devices without a zinc stannate film 26.

The photovoltaic device of the present invention is also more durable and stable than existing devices due to the improved chemical and mechanical properties of the zinc stannate film 26. In particular, zinc stannate films do not react with strong acids (e.g., HCl, $HNO_3$ and nitric/phosphoric acid), thus are resistant to the chemicals used in conventional ohmic contact processing. Because the zinc stannate film 26 functions as a "stop etch" protective buffer, the photovoltaic devices of the present invention are much less likely than conventional devices to short as a result of over etching.

Table 1 compares the open-circuit voltage ($V_{oc}$), short-circuit current ($J_{sc}$), fill factor (FF), and efficiency of two CdS/CdTe cells with thinner CdTe layers 30, one with a zinc stannate film 26 and one without. The cells were prepared as described in Example 2 below. As can be seen in Table 1, the efficiency of the photovoltaic device comprising a zinc stannate film 26 is significantly higher than the efficiency of the device without a buffer layer. The open circuit voltage and fill factor of the former device are also considerably higher. This great improvement of the thin CdTe cell is attributed to the zinc stannate layer playing a role as a nonconductive etch stop layer, thereby reducing shorting problems.

TABLE 1

| Device Structure | $V_{OC}$ (mV) | $J_{SC}$ (mA/cm$^2$) | Fill Factor (%) | Efficiency (%) |
|---|---|---|---|---|
| CTO/CdS/CdTe | 679 | 19.0 | 44.2 | 5.7 |
| CTO/ZTO/CdS/CdTe | 807 | 23.0 | 68.8 | 12.8 |

Another significant advantage associated with the photovoltaic device of the present invention is the improved mechanical properties due to the buffering effect of the zinc stannate film 26. In particular, the zinc stannate films deposited on TCO-coated substrates have remarkably good adhesion, and are less affected by $CdCl_2$ heat treatment than conventional photovoltaic devices, thus improving process reproducibility and product yield.

Table 2 compares the adhesiveness of three sets of CdS/CdTe cells, one set with a single TCO film 24 but no zinc stannate film 26, one set with a tin oxide (TCO) film 24 and a zinc stannate film 26, and one set with a cadmium stannate (TCO) film 24 and a zinc stannate film 26. The cells were prepared in the same laboratory and using similar materials and techniques. Each of the cells was soaked in a 100% saturated $CdCl_2$ solution for 15 minutes at −55° C., thermal annealed as described in Example 2, then evaluated for adhesion. As can be seen in Table 2, the adhesiveness of photovoltaic devices comprising a zinc stannate film 26 are significantly improved as compared to the control cell without a zinc stannate film. Under these extreme conditions (50–75% CdCl2 solution is typical) without the zinc stannate film 26, only one cell had good adhesion out of a total of 14 cells (7% yield). In sharp contrast, with the zinc stannate film 26, 79 out of 84 cells had good adhesion (94% yield). As will be appreciated by those skilled in this art, because of its excellent adhesiveness and resistance to post-deposition processing, the zinc stannate film 26 of the present invention offers device manufacturers considerable process latitude when optimizing the $CdCl_2$ process step.

TABLE 2

| | Control Cells (No $Zn_2SnO_4$ Film) | $SnO_2$-based Cell with $Zn_2SnO_4$ Film | $Cd_2SnO_4$-based Cell with $Zn_2SnO_4$ Film |
|---|---|---|---|
| Good adhesion | 1 (7%) | 19 (~90%) | 60 (~95%) |
| Blister on edges | 8 | 2 | 3 |
| Complete peel-off | 5 | 0 | 0 |
| Total | 14 | 21 | 63 |

A yet further significant advantage of the photovoltaic device of the present invention is the improved reproducibility in device performance as a result of the zinc stannate film 26. This is clearly seen in FIG. 4, which shows the efficiency of 30 identically processed devices (18 $Cd_2SnO_4$—based CdTe cells and 12 $SnO_2$—based CdTe cells), all of which included a zinc stannate film (no antireflection coating). The devices had an average efficiency of 13.83% with a standard deviation of 0.375.

The following examples demonstrate the practice and utility of the present invention but are not to be construed as limiting the scope thereof Any suitable laboratory equipment known to those skilled in the art can be utilized to fabricate films and solar cells and analyze electrical and optical properties. In the examples, $Zn_2SnO_4$ layers are deposited onto TCO-coated substrates using a modified SC-3000 evaporation system, manufactured by CVC Products, Inc. Optical measurements are made with a Cary 2300 spectrophotometer, manufactured by Varian Company.

EXAMPLE 1

Thin films of zinc stannate were prepared by RF magnetron sputtering. The sputtering was carried out at room temperature in a modified SC3000 evaporation system, evacuated to a background pressure of $1 \times 10^{-6}$ Torr and then backfilled with high purity oxygen. Corning 7059 glass substrates (with or without a TCO film) were placed on a water-cooled sample holder parallel to the target surface. The distance between the substrate and the target was varied from 7 to 10 cm. Commercial hot pressed oxide targets comprising 33 mol % $SnO_2$ and 67 mol % ZnO were used. Deposition was performed at an oxygen partial pressure of 10–20 m Torr with the RF power between 100 and 140 Watts, providing an average deposition rate of about 60–100 $Åmin^{-1}$.

FIG. 2 shows the transmittance, reflectance and absorptance of a zinc stannate film. As can be seen in this figure, the zinc stannate film exhibits near zero absorptance and a wide optical bandgap (~3.3 eV). The as-grown zinc stannate layer has a resistivity of more than 1000 Ω-cm. However, annealing the zinc stannate layer in CdS/Ar at a temperature in a range of 500–620° C. the resistivity to between about 0.1 and 10 Ω-cm, which matches the resistivity of the CdS window layer.

FIG. 3 shows an atomic force micrograph of the surface of the zinc stannate film. As is evident from this figure, zinc stannate films have very smooth surfaces, with an average surface roughness of ~20 Å. The grain size of the zinc stannate film is approximately 500 Å.

EXAMPLE 2

To compare the electrical properties of the photovoltaic devices of the present invention with those of conventional devices, two thin-film CdS/CdTe solar cells, one with and one without a zinc stannate film, were fabricated and analyzed using identical methods, as described below.

Two thin TCO films of cadmium stannate were prepared by RF magnetron sputtering. The sputtering was carried out at room temperature in a modified SC3000 evaporation system, evacuated to a background pressure of ~$1 \times 10^{-6}$ Torr and then backfilled with high purity oxygen. Corning 7059 glass substrates were placed on a water-cooled sample holder parallel to the target surface. The distance between the substrate and the target was varied from 6 to 9 cm. Commercial hot pressed oxide targets comprising 33 mol % $SnO_2$ and 67 mol % CdO) were used. Deposition was performed at an oxygen partial pressure of 10–20 mTorr with the RF power between 1100 and 140 Watts, providing an average deposition rate of about 10 nm $min^{-1}$.

The Cd$_2$SnO$_4$-coated substrates were heated at between 580° and –620° C. for about 20 minutes in a tube furnace containing argon of 99.999% purity flowing at a rate of 1500 sccm. The samples were placed in contact with a CdS-coated glass substrate during the heat treatment. The CdS was previously deposited by chemical bath deposition or RF sputtering as a thin layer on a glass substrate.

A film of zinc stannate was deposited on the top surface of each of the Cd$_2$SnO$_4$-coated substrates as described in Example 1 above.

A first semiconductor window layer of CdS was deposited on the top surface of the respective films by a chemical bath deposition (CBD) technique using CdAc$_2$, NH$_4$Ac, NH$_4$OH and thiourea in an aqueous solution. Prior to CdS deposition, the substrates with a SnO$_2$ layer were cleaned using a 1% Liquinox in hot DI (deionized) water with thorough rinsing (5 minutes DI water, 5 sonications in fresh DI, one sonication in hot DI). Substrates with a cadmium stannate film were cleaned by rinsing with TCE, then acetone, then IPA, followed by thorough rinsing.

The substrates were loaded into a quartz holder in a jacketed beaker and the chemical deposition bath was prepared as follows: (1) 550 mL of water was added to the jacketed beaker and was heated to 86–87° C. using a recirculator; (2) 8 mL of a 0.033 M (8.88 g/l) cadmium acetate solution was added; (3) 5.3 mL of a 1 M (77.08 g/l) ammonium acetate solution was added; (4) 15 mL of a stock (30%) ammonium hydroxide solution was added slowly, using a pipette; and (5) 8 mL of a 0.067 M (5.07 g/l) thiourea solution was added in four 2 mL aliquots with a 10 minute interval between each addition. During the entire procedure a magnetic stir bar was used to stir the solution. The jacketed beaker was kept covered to preserve temperature uniformity and pH level. Ten minutes after the final thiourea addition, the substrates were taken out and rinsed three times by sonication in warm DI water. The CdS films were then pre-treated in H$_2$ at 400° C. for 15 minutes.

Following the CdS anneal, approximately 5–10 microns of CdTe was deposited on the CdS films by close-space sublimation (CSS), as described by C. Ferekides, et al, 23rd IEEE SPVC Proc. (1993) pp.389–393). During CSS deposition, the substrate and source temperatures were 600° C. and 660° C., respectively. The distance between the substrate and the source was 0.2 cm, and the ambient pressure was 15 Torr (0.5 Torr O$_2$ and 14.5 Torr He). After CSS deposition, the substrates were soaked in either a 50% or 75% saturated solution of CdCl$_2$ at approximately 55° C. for 15 minutes, where the saturated solution was 7.5 g cadmium chloride dissolved in 500cc methanol. The devices were then annealed at 400° C. for 30 minutes in a tube furnace with a He/O$_2$ mixture (100 sccm He and 25 sccm O$_2$). Following this anneal, HgTe doped graphite paste and silver paste back contacts were deposited on the devices.

The structure of the photovoltaic device comprising a zinc stannate film is shown in FIG. 1. In the exemplified devices, the thickness of the zinc stannate film was between 0.08 and 0.15 microns.

Table 1 compares the open-circuit voltage (V$_{oc}$), short-circuit current (J$_{oc}$), fill factor (FF), and efficiency of the two CdS/CdTe cells (with and without a zinc stannate film). As can be seen in Table 1, the efficiency of the photovoltaic device comprising a zinc stannate film 26 is significantly higher (more than two times higher) than the efficiency of the device without a buffer layer. The open circuit voltage and fill factor of the former device are also considerably higher. Thus, the photovoltaic devices of the present invention offer the important advantages of increased open-circuit voltage, short-circuit current and fill factor, and hence improved efficiency, due to the presence of the zinc stannate films.

EXAMPLE 3

To compare the adhesiveness of the photovoltaic devices of the present invention with those of conventional devices without zinc stannate films, three sets of CdS/CdTe cells (one set with a single tin oxide or a single (TCO) film but no zinc stannate film, one set with a tin oxide film and a zinc stannate film, and one set with a cadmium stannate film and a zinc stannate film) were fabricated, treated, and analyzed as described below.

Tin oxide thin films were prepared by lower pressure chemical vapor deposition (LPCVD) technique with tetramethyl tin and oxygen as precursors. The zinc stannate film was prepared as described in Example 1 above. Thin film CdS/CdTe solar cells were prepared from each of the samples as described in Example 2, except that, after CSS deposition, the coated substrates were soaked in 100% saturated solution of CdCl$_2$ at approximately 55° C. for 15 minutes, then annealed at 400° C. for 30 minutes in a tube furnace with a He/O$_2$ mixture (100 sccm He and 25 sccm O$_2$). As can be seen in Table 2, the adhesiveness of the photovoltaic devices comprising a zinc stannate film 26 are significantly improved as compared to the control cell without a zinc stannate film.

EXAMPLE 4

Figure 4:
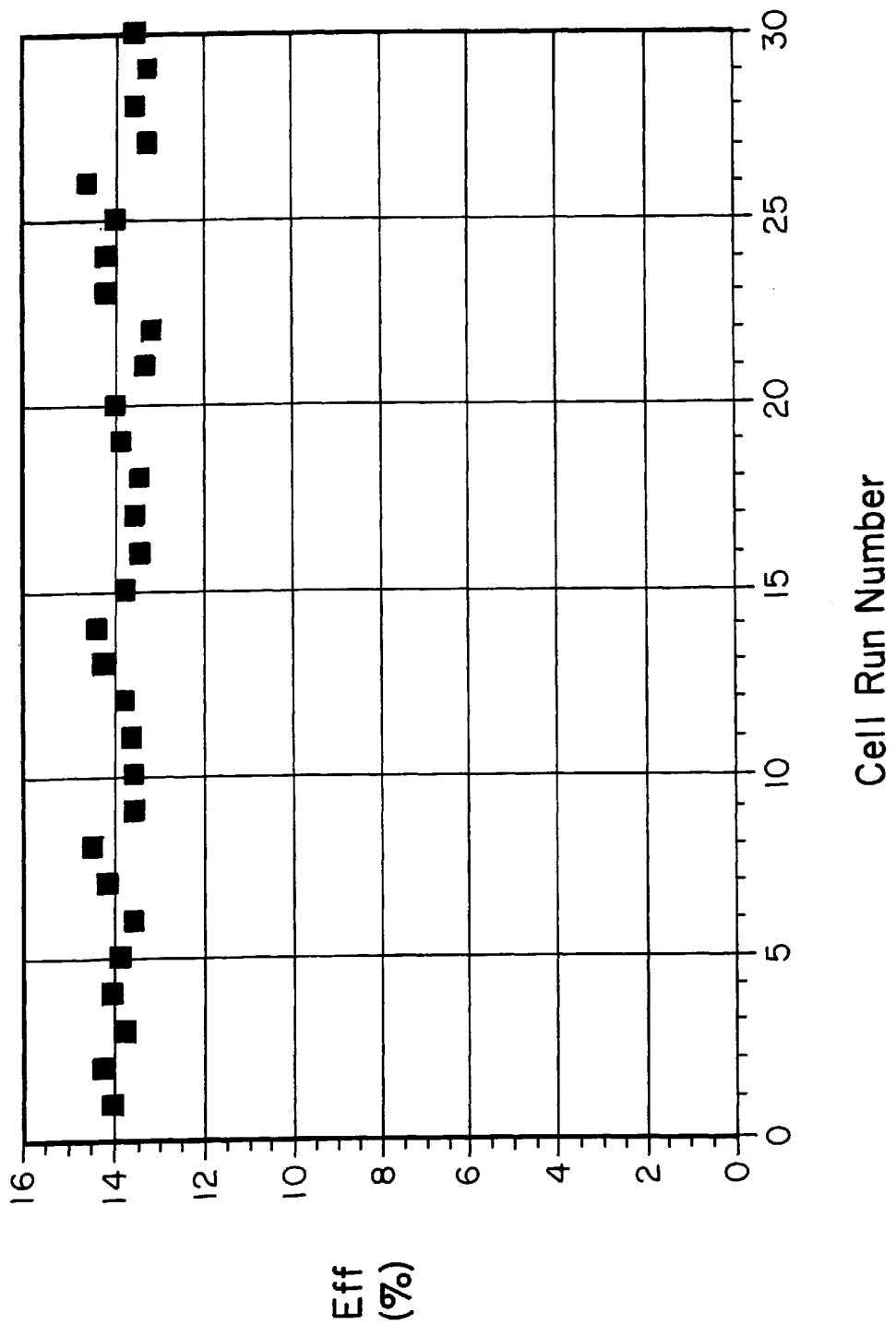
FIG. 4 is a graph showing the efficiency and reproducibility of CdS/CdTe photovoltaic devices of the present invention.
Figure 5:
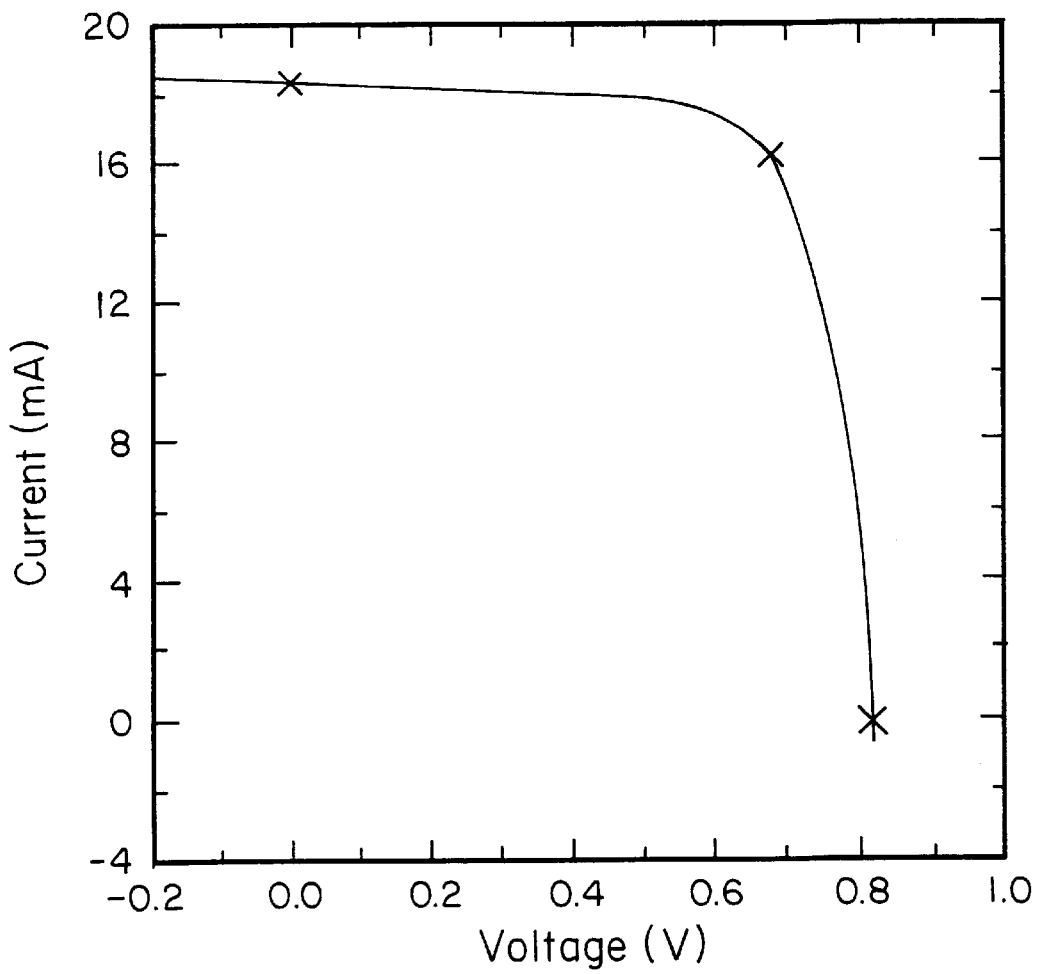
FIG. 5 is a graph of current versus voltage for a photovoltaic device of the present invention.

Thirty CdS/CdTe thin film solar cells (18 Cd$_2$SnO$_4$-based CdTe cells and 12 SnO$_2$-based CdTe cells), each comprising a zinc stannate film, were prepared as described in Example 2 above. As indicated in FIG. 4, CdS/CdTe cells having a zinc stannate film exhibit high efficiency (average efficiency 13.83%) and reproducibility (standard deviation 0.375). FIG. 5 provides an I–V curve for a cadmium stannate-based CdS/CdTe solar cell comprising a zinc stannate film. The performance parameters for the device shown in FIG. 5 are as follows: open circuit voltage (V$_{oc}$)=0.8284V; V$_{max}$=6597 V; short circuit current density (J$_{sc}$)=24.48 mAcm$^{-2}$; fill factor (FF)=73.80%; and efficiency=15.0%. In general, cadmium stannate-based cells comprising a zinc stannate film have improved device performance baseline cells compared to those without the zinc stannate buffer layer.

The foregoing description is considered as illustrative only of the principles of the invention. Further, since numerous modifications and changes will readily occur to those skilled in the art, it is not desired to limit the invention to the exact construction and process shown as described above. Accordingly, resort may be made to all suitable modifications and equivalents that fall within the scope of the invention as defined by the claims which follow.

What is claimed is:

The embodiments of the invention in which an exclusive property or privilege is claimed are defined as follows:

1. A thin-film Cds/CdTe heterojunction photovoltaic device that has front contact layer of transparent conductive oxide (TCO) and further comprises:
   a layer of zinc stannate interposed between the transparent conducting oxide (TCO) layer and the thin-film CdS/CdTe.

2. The thin-film CdS/CdTe heterojunction photovoltaic device of claim 1, wherein the zinc stannate layer is spinel crystalline Zn$_2$SnO$_4$.

3. A method of preventing localized TCO/CdTe junctions in a thin-film CdS/CdTe heterjunction photovoltaic device that has a CdS layer and aCdTe layer and in which the CdS layer is pouitioned between a front contact layer of transparent conductive oxide (TCO) and the CdTe layer, wherein the method comprises:

interposing a layer of zinc stannate between the layer of transparent conductive oxide (TCO) and the CdS layer.

4. The method of claim 3, wherein said zinc stannate layer is spinel crystalline $Zn_2SnO_4$.

5. The method of claim 4, comprising:

heat treating the CdS layer and the CdTe layer together with the layer of zinc stannate and the TCO front contact layer at a temperature of about 600° C.

6. A method of preventing etched grain boundary shunts between a metallic back contact layer and a TCO front contact layer in a thin-film CdS/CdTe heterojunction photovoltaic device that has a CdS layer and a CdTe layer positioned between the transparent conductive oxide (TCO) front contact layer and the metallic back contact layer, wherein the method comprises:

interposing a layer of zinc stannate between the TCO front contact layer and the CdS layer.

7. The method of claim 5, wherein said zinc stannate is spinel crystalline $Zn_2SnO_4$.

8. A method of relieving interlayer stresses and preventing blistering and peeling from heat treating a CdS layer and a CdTe layer in a thin-film CdS/CdTe heterojunction photovoltaic device that has a CdS layer and a CdTe layer with a transparent conductive oxide (TCO) front contact layer positioned between a substrate and the CdS layer, wherein the method comprises:

interposing a layer of zinc stannate between the TCO front contact layer and the CdS layer prior to the heat treating.

9. The method of claim 8, wherein said zinc stannate is spinel crystalline $Zn_2SnO_4$.

10. The method of claim 8, comprising:

heat treating the CdS layer and the CdTe layer together with the layer of zinc stannate and the TCO front contact layer at a temperature in a range of about 400 to 700° C.

11. A method of fabricating a thin-film CdS/CdTe heterojunction device, comprising:

depositing a TCO layer on a transparent substrate;

depositing a zinc stannate layer on the TCO layer;

depositing a CdS/CdTe heterojunction structure on the zinc stannate layer;

annealing the CdS/CdTe heterojunction structure;

surface etching the CdS/CdTe heterojunction structure to obtain a $p^+$ surface region; and depositing a back contact on the CdTe layer with a $p^+$ surface region.

12. The method of claim 11, wherein the zinc stannate is $Zn_2SnO_4$ in a spinel crystal structure after said annealing.

13. A thin-film photovoltaic device comprising:

a substrate;

a film of transparent conductive oxide disposed on said substrate as a front contact;

a film of $Zn_2SnO_4$ disposed on said film of transparent conductive oxide;

a thin film comprising two or more layers of semiconductor materials forming a p/n or a p/i/n junction disposed on said film of $Zn_2SnO_4$; and an electrically conductive film disposed on said thin film of semiconductor materials to form a rear electrical contact to said thin film.

14. The photovoltaic device of claim 13, wherein said substrate is transparent.

15. The photovoltaic device of claim 14, wherein said substrate is selected from the group consisting of silica and glass.

16. The photovoltaic device of claim 13, wherein said film of transparent conductive oxide comprises $SnO_2$.

17. The photovoltaic device of claim 13, wherein said film of transparent conductive oxide comprises $Cd_2SnO_4$.

18. The photovoltaic device of claim 13, wherein said thin film of semiconductor materials comprises cadmium sulfide.

19. The photovoltaic device of claim 13, wherein said thin film of semiconductor materials comprises cadmium telluride.

20. The photovoltaic device of claim 13, wherein said substrate, said film of transparent conductive oxide, and said film of $Zn_2SnO_4$ are substantially transparent to light between about 400 nm and 1000 nm.

21. The photovoltaic device of claim 13, wherein said film of $Zn_2SnO_4$ is in a range of about 200 to 300 Å A thick.

22. The photovoltaic device of claim 13, wherein said film of $Zn_2SnO_4$ is about 1000 Å thick.

23. The photovoltaic device of claim 13, wherein said film of $Zn_2SnO_4$ has a sheet resistivity greater than about 1000 ohm-cm.

24. A method for fabricating a photovoltaic device, comprising:

depositing a film of transparent conductive oxide onto a substrate;

depositing a film of $Zn_2SnO_4$ onto said film of transparent conductive oxide;

depositing onto said film of $Zn_2SnO_4$ a thin film comprising dissimilar semiconductor materials that together form a p/n or a p/i/n junction; and depositing an electrically conductive film onto said thin film of semiconductor materials to provide an electrical contact therewith.

25. The method of claim 24, wherein depositing the film of $Zn_2SnO_4$ onto the substrate comprises:

(a) RF sputter coating a substantially amorphous $Zn_2SnO_4$ layer onto said film of transparent conductive oxide; and (b) heating the $Zn_2SnO_4$ layer and semiconductor materials to a treatment temperature sufficient to induce crystallization of the $Zn_2SnO_4$ layer into a uniform single-phase spinel structure and for a time sufficient to allow full crystallization of the $Zn_2SnO_4$ layer at the treatment temperature to produce a poly-crystal $Zn_2SnO_4$ film.

26. The method of claim 25, wherein said substantially amorphous $Zn_2SnO_4$ layer is sputter coated onto said film of transparent conductive oxide at room temperature.

27. The method of claim 25, wherein said substantially amorphous $Zn_2SnO_4$ layer is RF sputtered onto said film of transparent conductive oxide in an atmosphere consisting essentially of oxygen.

28. The method of claim 25, wherein said treatment temperature is less than about 650° C.

29. The method of claim 24, wherein said step of depositing a thin film of semiconductor materials onto said layer of $Zn_2SnO_4$ comprises a chemical bath deposition, or an RF sputtering deposition, or a close-space sublimation deposition.

\* \* \* \* \*